(12) United States Patent
Shin et al.

(10) Patent No.: US 11,630,528 B2
(45) Date of Patent: Apr. 18, 2023

(54) DISPLAY PANEL, DISPLAY DEVICE AND TOUCH DISPLAY PANEL

(71) Applicant: LG DISPLAY CO., LTD., Seoul (KR)

(72) Inventors: SeungMok Shin, Paju-si (KR); Hyunkyung Kim, Paju-si (KR); ChangHwan Seo, Paju-si (KR); SeungChul Park, Paju-si (KR); KiJeong Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 2 days.

(21) Appl. No.: 17/357,522

(22) Filed: Jun. 24, 2021

(65) Prior Publication Data
US 2022/0206608 A1     Jun. 30, 2022

(30) Foreign Application Priority Data
Dec. 24, 2020 (KR) .......................... 10-2020-0183918

(51) Int. Cl.
*G06F 3/041* (2006.01)
*G09G 3/20* (2006.01)

(52) U.S. Cl.
CPC ........ *G06F 3/0412* (2013.01); *G06F 3/04164* (2019.05); *G09G 3/20* (2013.01); *G06F 3/04166* (2019.05); *G09G 2310/0267* (2013.01); *G09G 2310/0275* (2013.01)

(58) Field of Classification Search
CPC .............. G06F 3/0412; G06F 3/04164; G06F 3/04166; G09G 3/20; G09G 2310/0267; G09G 2310/0275
See application file for complete search history.

(56) References Cited

U.S. PATENT DOCUMENTS

| | | | |
|---|---|---|---|
| 2008/0094321 A1* | 4/2008 | Park | H01L 27/3276 445/24 |
| 2018/0181277 A1* | 6/2018 | Ahn | G06F 3/0481 |
| 2018/0188867 A1* | 7/2018 | Yeh | G06F 3/0443 |

* cited by examiner

*Primary Examiner* — Peter D McLoone
(74) *Attorney, Agent, or Firm* — Birch, Stewart, Kolasch & Birch, LLP

(57) ABSTRACT

Discussed are a display panel which can be applied to a touch display device by changing a design of a conductive layer to electrically connect a plurality of pads to a plurality of common electrodes, and a display device and a touch display panel device thereof.

12 Claims, 14 Drawing Sheets

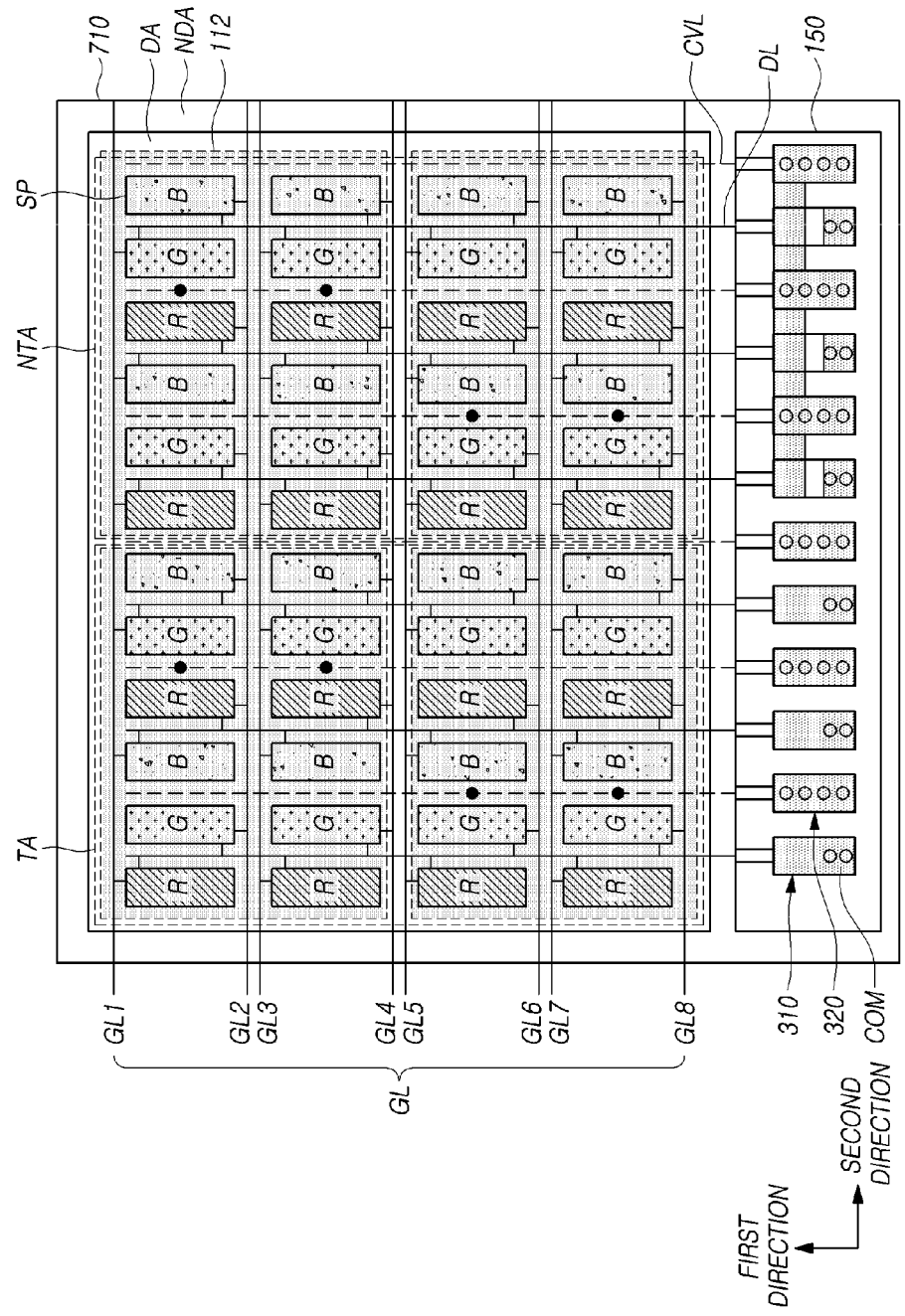

DISPLAY PANEL, DISPLAY DEVICE AND TOUCH DISPLAY PANEL

CROSS REFERENCE TO RELATED APPLICATION

This application claims priority to Korean Patent Application No. 10-2020-0183918, filed on Dec. 24, 2020 in the Republic of Korea, the entire contents of which are hereby expressly incorporated by reference in its entirety into the present application.

BACKGROUND

Field of the Disclosure

The present disclosure relates to a display panel, a display device and a touch display panel.

Description of the Background Art

With the development of the information society, there has been an increasing demand for a variety of types of display devices. In this regard, various devices, such as liquid crystal display (LCD) devices, organic light-emitting diode (OLED) display devices, etc., have recently come into widespread use.

Such a display device provides a touch-based input method that allows a user to easily input information, breaking away from usual input methods using a button, a keyboard, and a mouse.

In order to provide a touch display device capable of providing such a touch-based input method, a panel applicable to the touch display device needs to be newly designed.

SUMMARY OF THE INVENTION

Various aspects of the present disclosure provide a display panel, a display device, and a touch display panel capable of simultaneously driving a plurality of common electrodes.

Also provided are a display panel, a display device, and a touch display panel capable of individually driving a plurality of common electrodes by minimizing design changes of the display panel.

Also provided are a display panel, a display device, and a touch display panel changing only a part of the design of the panel.

Also provided are a touch display panel capable of providing both an image display function and a touch function in a portion of the panel and only the image display function in the remaining portion of the panel.

Also provided are a display panel, a display device, and a touch display panel capable of shortening a period needed to develop a product that can be applied to a touch display device by minimizing the design change of the panel.

According one aspect, a display panel includes a plurality of first pads electrically connected to a plurality of data lines disposed in a display area, a plurality of second pads electrically connected to common voltage lines driving a plurality of common electrodes disposed in the display area, a conductive layer of a first pattern disposed in at least a partial area on the plurality of first pads and electrically connected to the plurality of data lines, and a conductive layer of a second pattern disposed in at least a partial area on the plurality of second pads, electrically connected to at least two or more of the plurality of common electrodes, and disposed separately from the first pattern.

According to another aspect, a display device includes a display panel comprising a plurality of first pads electrically connected to a plurality of data lines disposed in a display area, a plurality of second pads electrically connected to common voltage lines driving a plurality of common electrodes disposed in the display area, a conductive layer of a first pattern disposed in at least a partial area on the plurality of first pads and electrically connected to the plurality of data lines, and a conductive layer of a second pattern disposed in at least a partial area on the plurality of second pads, electrically connected to at least two or more of the plurality of common electrodes, and disposed separately from the first pattern, and a data driver driving the plurality of data lines and the plurality of common voltage lines.

According to another aspect, a display device includes a display area comprising a touch area and a non-touch area, a pad portion of a touch area disposed in at least a partial area of a non-display area other than the display area wherein at least two pads for driving at least two lines disposed in the non-touch area are disposed, and the conductive layer disposed on the pads is disposed as a third pattern, and a pad portion of a non-touch area disposed in the remaining partial area of the non-display area wherein the pads for driving the lines disposed in the non-touch area are disposed, and the conductive layer disposed on the pads is disposed as a fourth pattern different from the third.

The pad portion of the non-touch area can comprise a plurality of first pads electrically connected to a plurality of data lines disposed in the non-touch area, a plurality of second pads electrically connected to a plurality of common voltage lines driving a plurality of common electrodes disposed in the non-touch area, the conductive layer of a data voltage application pattern disposed in at least a partial area on the plurality of first pads and electrically connected to the plurality of data lines, and a common voltage application pattern disposed in at least a partial area on the plurality of second pads, electrically connected to at least two or more of the plurality of common electrodes, and separated from the data voltage application pattern.

The pad portion of the touch area can comprise a plurality of first pads electrically connected to the plurality of data lines disposed in the touch area, a plurality of second pads electrically connected to a plurality of sensing lines driving a plurality of touch electrodes disposed in the touch area; and the conductive layer insulated from each other on the plurality of first pads and the plurality of second pads.

According to exemplary aspects, a display panel, a display device, and a touch display panel can simultaneously drive a plurality of common electrodes.

According to exemplary aspects, a display panel, a display device, and a touch display panel can individually drive a plurality of common electrodes by minimizing design changes of the display panel.

According to exemplary aspects, a display device, and a touch display panel can change only a part of the design of the panel.

According to exemplary aspects, a touch display panel can provide both an image display function and a touch function in a portion of the panel and only the image display function in the remaining portion of the panel.

According to exemplary aspects, a display panel, a display device, and a touch display panel can shorten a period needed to develop a product that can be applied to a touch display device by minimizing the design change of the panel.

BRIEF DESCRIPTION OF THE DRAWINGS

The present invention will become more fully understood from the detailed description given hereinbelow and the accompanying drawings which are given by way of illustration only, and thus are not limitative of the present invention.

FIG. 9A is a plan view of an example of the touch display panel of FIG. 7.

DETAILED DESCRIPTION OF THE EMBODIMENTS

Figure 1:
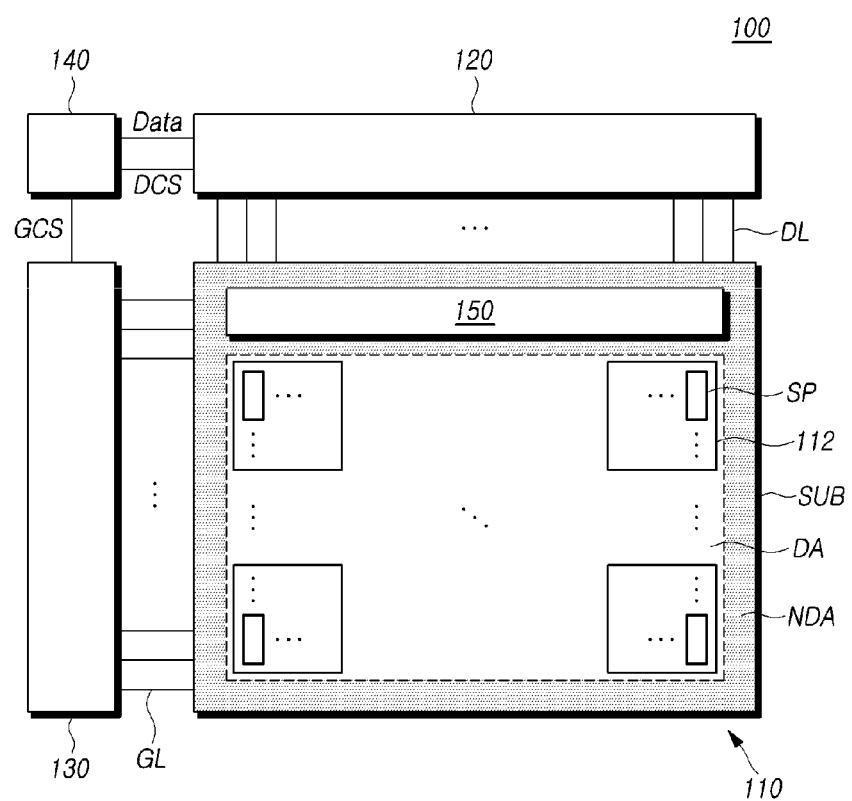
FIG. 1 illustrates a schematic configuration of a display device according to embodiments of the present disclosure.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another.

Further, in the following description of examples or embodiments of the present invention, detailed descriptions of well-known functions and components incorporated herein will be omitted when it is determined that the description can make the subject matter in some embodiments of the present invention rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" can be used herein to describe elements of the present invention. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element can be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms can be used to describe non-consecutive or non-sequential processes or operations unless the term "directly" or "immediately" is used together.

In addition, when any dimensions, relative sizes etc. are mentioned, it should be considered that numerical values for elements or features, or corresponding information (e.g., level, range, etc.) include a tolerance or error range that can be caused by various factors (e.g., process factors, internal or external impact, noise, etc.) even when a relevant description is not specified. Further, the term "may" fully encompasses all the meanings of the term "can".

Hereinafter, various aspects of the present disclosure will be described in detail with reference to the accompanying drawings.

FIG. 1 illustrates a schematic configuration of a display device according to embodiments of the present disclosure. All components of the display device according to all embodiments of the present disclosure are operatively coupled and configured.

Referring to FIG. 1, a display device 100 according to the embodiments can include a display panel 110 and a driver circuit for driving the display panel 110.

The driver circuit can include a data driver 120, a gate driver 130, a display controller 140 for controlling the data driver 120 and the gate driver 130, and the like.

The display panel 110 can include a substrate SUB and various signal lines of a plurality of data lines DL and a plurality of gate lines GL, and the like disposed on the display panel 110. The display panel 110 can include a plurality of subpixels SP connected with of the plurality of gate lines GL and the plurality of data lines DL.

The display panel 110 can include a display area DA in which images are displayed and a non-display area NDA in which no images are displayed. The plurality of subpixels SP displaying images is disposed in the display area DA.

A pad portion can be disposed in the non-display area NDA, with an integrated circuit and a printed circuit being electrically connected to the pad portion. The driver circuits 120, 130 and 140 are connected with the pad portion. The driver circuits 120, 130, and 140 can be mounted in the non-display area NDA.

The data driver 120 can drive the plurality of data lines DL by outputting a data voltage Vdata to the plurality of data lines DL. The gate driver 130 can drive the plurality of gate lines GL by outputting a scanning signal Vgate to the plurality of gate lines GL. The display controller 140 can control the driving operations of the data driver 120 and the gate driver 130 by supplying a variety of control signals DCS and GCS necessary for the driving operations of the data driver 120 and the gate driver 130.

The display controller 140 starts scanning at points in time realized by respective frames, converts image data input from an external source into image data DATA having a data signal format readable by the data driver 120, outputs the converted image data DATA, and controls data driving at appropriate points in time according to the scanning.

The display controller 140 receives timing signals, including a vertical synchronization signal Vsync, a horizontal synchronization signal Hsync, an input data enable signal DE, a clock CLK signal, and the like, from an external source (e.g. a host system).

The display controller 140 generates a variety of control signals DCS and GCS using the timing signals, and outputs the variety of control signals DCS and GCS to the data driver 120 and the gate driver 130 in order to control the data driver 120 and the gate driver 130.

For example, the display controller 140 outputs a variety of gate control signals GCS, including a gate start pulse (GSP) signal, a gate shift clock (GSC) signal, a gate output enable (GOE) signal, and the like, to control the gate driver 130.

In addition, the display controller 140 outputs a variety of data control signals DCS, including a source start pulse (SSP) signal, a source sampling clock (SSC) signal, a source output enable (SOE) signal, and the like, to control the data driver 120.

The display controller 140 can be provided as a component separate from the data driver 120, or can be provided as an integrated circuit (IC) combined (or integrated) with the data driver 120.

The data driver 120 receives image data DATA from the display controller 140 and supplies a data voltage to the plurality of data lines DL to drive the plurality of data lines DL. The data driver 120 can also be referred to as a source driver.

The data driver 120 can include one or more source driver ICs or data driver ICs SDICs.

Each of the source driver ICs can include a shift register, a latch circuit, a digital-to-analog converter (DAC), an output buffer, and the like. In some cases, the data driver 120 can further include one or more analog-to-digital converters (ADCs).

For example, each of the source driver ICs can be connected to a bonding pad of the display panel 110 by a tape-automated bonding (TAB) method or by a chip-on-glass (COG) method, or can directly mounted on the display panel 110. In some cases, each of the source driver ICs can be integrated with the display panel 110. In addition, each of the source driver ICs can be implemented using a chip-on-film (COF) structure. In this case, each of the source driver ICs can be mounted on a circuit film to be electrically connected to the data lines DL in the display panel 110 via the circuit film.

The gate driver 130 can output a gate signal of a turn-on level voltage or a gate signal of a turn-off level voltage under the control of the display controller 140. The gate driver 130 can sequentially drive the plurality of gate lines GL by sequentially supplying the gate signals of the turn-on level voltage to the plurality of gate lines GL.

The gate driver 130 can be connected to the display panel 110 by a tape automated bonding (TAB) method, be connected to a bonding pad of the display panel 110 by a chip-on-glass (COG) or chip-on-panel (COP) method, or be connected to the display panel 110 by a chip-on-film (COF) method. The gate driver 130 can be implemented using gate-in-panel (GIP) structure disposed within the non-display area of the display panel 110. The gate driver 130 can be disposed on the substrate SUB or connected to the substrate SUB. For example, in the case of the GIP structure, the gate driver 130 can be disposed in the non-display area NDA of the substrate SUB. The gate driver 130 can be connected to the substrate SUB in the case of the COG method, the COF method, or the like.

When the specific gate line GL is turn-on by the gate driver 130, the data driver 120 converts the image data DATA received from the display controller 140 into an analog data signal Vdata and supplies it to a plurality of data lines DL.

The data driver 120 can be connected to one side (e.g., upper or lower side) of the display panel 110. Depending on the driving method, the panel design method, and the like, the data driver 120 can be connected to both sides of the display panel 110 (e.g., upper and lower sides), or can be connected to two or more of the four sides of the display panel 110.

The gate driver 130 can be connected to one side (e.g., left or right side) of the display panel 110. Depending on the driving method, the panel design method, and the like, the gate driver 130 can be connected to both sides of the display panel 110 (e.g., left and right side), or can be connected to two or more of the four sides of the display panel 110.

The display controller 140 can be a timing controller used in a display technology, or a control device capable of further performing other control functions including a timing controller. The display controller 140 can be a control device different from the timing controller, or can be a circuit in the control device. The display controller 140 can be implemented with various circuits or electronic components such as an integrated circuit (IC), a field programmable gate array (FPGA), an application specific integrated circuit (ASIC), or a processor.

The display controller 140 can be mounted on a printed circuit board, a flexible printed circuit, and the like, and be electrically connected to the data driver 120 and the gate driver 130 through the printed circuit board, the flexible printed circuit, and the like.

The display device 100 according to the present embodiments can be a display device including a backlight unit such as a liquid crystal display (LCD) device, or a self-luminous display such as an Organic Light Emitting Diode (OLED) display, a quantum dot display and a micro Light Emitting Diode (LED) display.

When the display device 100 according to the present embodiments is the OLED display, each subpixel SP can include an organic light emitting diode OLED that emits light by itself as a light emitting device. When the display device 100 according to the present embodiments is the quantum dot display, each subpixel SP can include a light emitting device made of a quantum dot, which is a semiconductor crystal that emits light by itself. When the display device 100 according to the present embodiments is the micro LED display, each subpixel SP can emit light by itself and include a micro LED (Micro Light Emitting Diode) made based on an inorganic material as a light emitting device.

Figure 2:
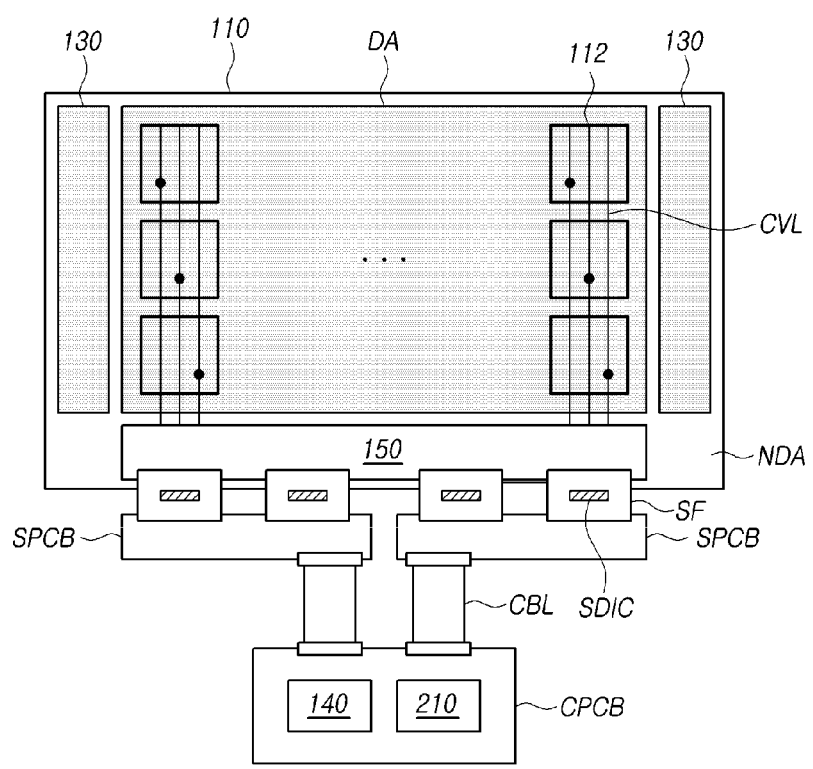
FIG. 2 illustrates a system of a display device according to embodiments of the present disclosure.

FIG. 2 illustrates a system of the display device according to an example of the present disclosure.

Referring to FIG. 2, the display panel 110 can include the display area DA in which the image is displayed and the non-display area NDA in which the image is not displayed.

The data driver 120 can be comprised of one or more source driver ICs SDICs. When the data driver 120 can be implemented using the COF structure, each of the source driver ICs SDICs can be mounted on a circuit film SF connected to the non-display area NDA of the display panel 110.

The gate driver 130 can be implemented using the GIP structure. In a case in which the gate driver 130 has the GIP structure, the gate driver 130 can be disposed in the non-display area NDA of the display panel 110 as shown in FIG. 2. However, the gate driver 130 can be implemented by the COF structure.

The display device 100 can include at least one source printed circuit board SPCB and a control printed circuit board CPCB, on which control components and a variety of electric devices are mounted, in order to connect the plurality of source driver ICs SDIC to the circuits of the other devices.

The other portion of each of the circuit films SF, on which the source driver IC SDICs are mounted, can be connected to the at least one source printed circuit board SPCB. For example, one portion of each of the circuit films SF, on which the source driver ICs SDIC are mounted, can be electrically connected to the non-display area NDA of the display panel 110, while the other portion of each of the circuit films SF can be electrically connected to the source printed circuit board SPCB. The circuit film SF can overlap and be attached to the pad portion 150 of the display panel 110.

The display controller 140 and a power management integrated circuit 210, and the like can be disposed on the control printed circuit board CPCB. The power management IC supplies various forms of voltage or current to the display panel 110, the data driver 120, the gate driver 130, and the like, or controls various forms of voltage or current to be supplied to the same.

The source printed circuit board SPCB and the control printed circuit board CPCB can be connected to each other via at least one connector CBL. The connector CBL can be, for example, a flexible printed circuit FPC, a flexible flat cable FFC, a connecting cable or the like.

The at least one source printed circuit board SPCB and the control printed circuit board CPCB can be integrated (or combined) into a single printed circuit board.

The display device 100 can further include a level shifter for adjusting a voltage level. For example, the level shifter can be disposed on the control printed circuit board CPCB or the source printed circuit board SPCB. In the display device 100, the level shifter can supply signals needed for gate driving to the gate driver 130. For example, the level shifter can supply a plurality of clock signals to the gate driver 130. Accordingly, the gate driver 130 can output a plurality of gate signals to the plurality of gate lines GL based on a plurality of clock signals input from the level shifter.

Figure 3:
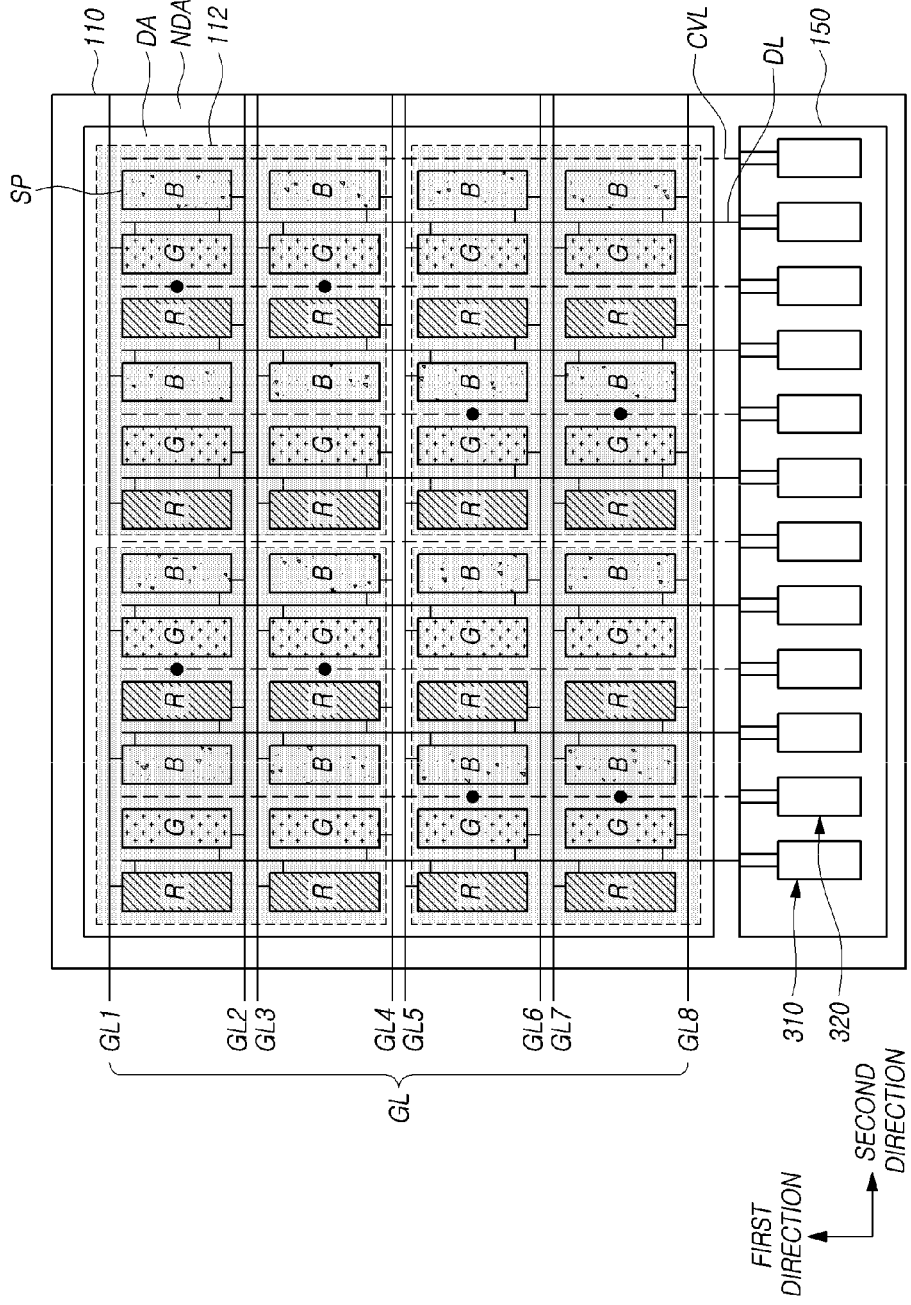
FIG. 3 is a plan view of an example of the display panel of FIG. 2.

FIG. 3 is a plan view of an example of the display panel of FIG. 2.

Referring to FIG. 3, the display panel 110 can include a display area DA in which an image is displayed and a non-display area NDA in which an image is not displayed. A plurality of subpixels R, G, and B for displaying an image can be disposed in the display area DA.

The subpixels R, G, and B are arranged in a matrix form in the first and second directions.

In the display panel 110, a plurality of data lines DL extend in a first direction, and a plurality of gate lines GL extend in the second direction different from the first direction.

Any two of the gate lines GL can be disposed adjacent to each other. Here, the meaning of being disposed adjacent to each other can mean that the subpixels R, G and B are not disposed between two gate lines GL.

A plurality of gate lines GL can include first to eighth gate lines GL1 to GL8. In this case, the second and third gate lines GL2 and GL3, the fourth and fifth gate lines GL4 and GL5, and the sixth and seventh gate lines GL6 and GL7 can be disposed adjacent to each other. The subpixels R, G and B are not disposed between two gate lines GL thereof. For example, the subpixels R, G and B are not disposed between the second and third gate lines GL2 and GL3.

One of two gate lines disposed adjacent to each other can be connected to one of the upper right pixel or the lower left subpixel, and the other of them can be connected to the other of the upper right pixel or the lower left subpixel in turn. For example, the second gate line GL2 of the second and third gate lines GL2 and GL3 can be connected to the upper right pixel G, and the third gate line GL3 thereof can be connected to the lower left subpixel R.

When the two gate lines GL are disposed adjacent to each other, the data line DL can be disposed in the odd-numbered column, and the data line DL may not be disposed in the even-numbered column. In contrast, the data line DL can be disposed in the even-numbered column and the data line DL may not be disposed in the odd-numbered column.

One data line DL is connected to both adjacent subpixels. For example, the first data line DL in FIG. 3 is connected to two adjacent subpixels R and G in each row.

When the gate signals Vgate are sequentially supplied to the gate lines GL, the data signals Vdata are applied alternately to the subpixels through the data line DL. In particular, when the gate signals Vgate are sequentially supplied, the data signals Vdata are applied alternately to two subpixels, to which the two gate lines GL adjacent to each other are connected, through one data line DL.

Such a driving method driving the subpixels of the display panel 110 through one data line in a zigzag manner as mentioned above can be referred to as a double rate driving DRD method.

When the double rate driving DRD method is used to drive the display device 100, both subpixels can be driven with one data line DL to reduce the number of data lines DL by half. In addition, since the number of data lines DL is reduced, there can be applied the data driver 120 having a small number of channels for outputting data signals to the display panel 110. In addition, when the data driver 120 applies the plurality of data driver integrated circuits SDICs, the number of data driver integrated circuits SDICs can be reduced.

As mentioned above, when the common electrode 112 is separated into two or more and disposed on the display panel 110, the common voltage Vcom is applied to the plurality of separated common electrodes 112 on the display panel 110 through the plurality of common voltage lines CVL. In FIG. 3, the common electrode 112 is separated into four and the common voltage line CVL of the four is disposed, but the number of separated common electrodes 112 and common voltage lines CVL can vary.

Each common voltage line CVL is electrically connected to the separated common electrode 112. Each common voltage line CVL can be electrically connected to each common electrode 112 at one or two or more locations. For example, each common voltage line CVL can be electrically connected to each common electrode 112 at two locations in FIG. 3.

The plurality of common voltage lines CVL can extend in the same first direction as the direction in which the data line DL extends on the display panel 110.

The plurality of data lines DL and the plurality of common voltage lines CVL can be alternately disposed on the display panel 110. For example, the plurality of data lines DL are disposed in the odd-numbered column, and a plurality of common voltage lines CVL are disposed in the even-numbered column. In contrast, a plurality of common voltage lines CVL can be disposed in an odd-numbered column, and a plurality of data lines DL can be disposed in an even-numbered column.

The connected pad portion 150 electrically connected to the plurality of data lines DL and common voltage lines CVL in the display area DA can be disposed in at least a portion of the non-display area NDA of the display panel 110.

A plurality of first pads 310 electrically connected to a plurality of data lines DL can be disposed on the pad portion 150. In addition, a plurality of second pads 320 electrically connected to the common voltage line CVL can be disposed on the pad portion 150.

The plurality of first pads 310 and the plurality of second pads 320 can be disposed alternately on the pad portion 150.

For example, as shown in FIG. 3, the pad portion 150 of the display panel 110 can be designed to dispose the plurality of first pads 310 for driving the plurality of data lines DL and a plurality of second pads 320 for driving the plurality of common electrodes 112.

On the other hand, pad portion 150 of the display panel 110 can be designed to dispose the plurality of first pads 310 for driving a plurality of data lines DL and one second pad 320 for driving one common electrode 112 which is not divided into a plurality of the electrodes. In this case, one second pad 320 for driving one common electrode 112 can be designed to be disposed on the pad unit 150.

On the other hand, apart from the development of the display panel 110 having only an image display function, it is also necessary to develop a touch display panel having a touch function.

In the case of such a touch display panel, the touch sensor can be formed after the manufacturing process of the touch display panel as an external type, for example, an add-on type, but the touch sensor can be formed together during the manufacturing process of the touch display panel. When the touch sensor is embedded in a touch display panel, such a touch display device is referred to as a built-in type touch display device.

In the case of such a built-in type touch display device, the plurality of common electrodes 112 as mentioned above are used as a plurality of touch electrodes TE.

As will be described later, the touch display device can apply a touch driving signal TDS to at least one touch electrode TE among a plurality of touch electrodes TE during the touch period TS. In addition, the touch driving signal TDS can be applied to the touch electrode TE of the separated common electrodes 112 through the second pad 320 disposed on the pad portion 150 and a common voltage line CVL.

As described above, only one common electrode 112 is disposed on the display panel 110 for image display without being divided and one second pad 320 for driving the one common electrode 112 is provided on the pad portion 150. In addition, the touch display panel providing a touch sensing function can be divided into the plurality of common electrodes 112, and the plurality of second pads 320 for driving the plurality of common electrodes 112 can be provided on the pad portion 150.

Accordingly, the design of the common electrode 112 and the pad portion 150 are all different between the display panel 110 and the touch display panel, and thus there is a problem that components cannot be shared between them. Accordingly, there is needed the design of the common electrode 112 and the pad portion 150 that can use the display panel 110 as a touch display panel by changing the design of the pad unit 150 to a minimum.

Figure 4A:
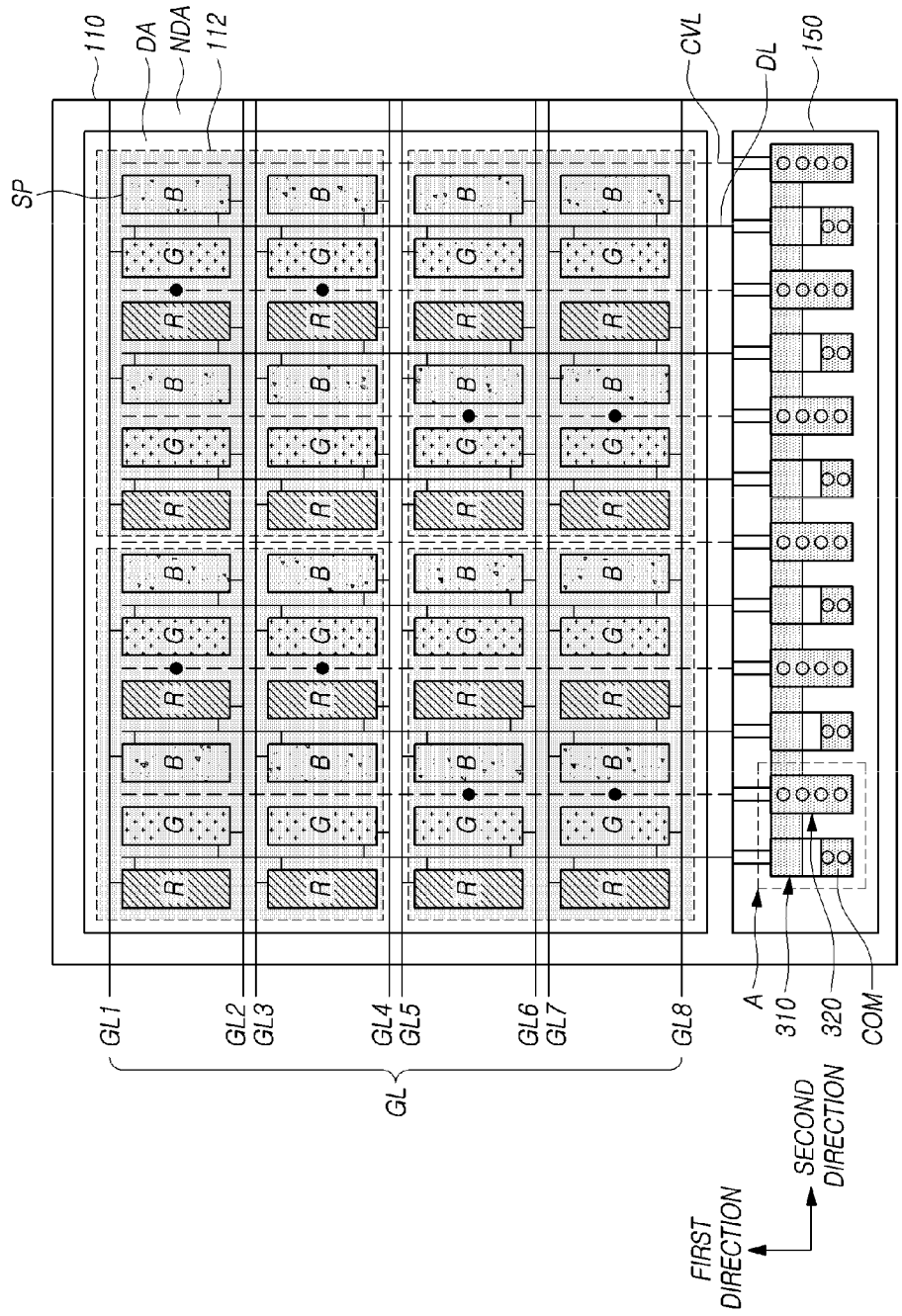
FIG. 4A is a plan view of another example of the display panel of FIG. 2.

FIG. 4A is a plan view of another example of the display panel 110 of FIG. 2.

Referring to FIG. 4A, a conductive layer COM is disposed on the plurality of first pads 310 and the plurality of second pads 320 in the pad portion 150.

The conductive layer COM can electrically connect the plurality of second pads 320 to each other. The conductive layer COM is electrically connected to the common voltage line CVL through contact holes disposed on the plurality of second pads 320.

The conductive layer COM is electrically connected to the data line DL through contact holes disposed on the plurality of first pads 310.

The conductive layer COM that electrically connects the second pads 320 to each other and the conductive layer COM on the first pad 310 are insulated from each other.

The conductive layer COM, which electrically connects the second pads 320, electrically connects two different second pads 320 across the first pad 310 to electrically connect the plurality of second pads 320 to each other. In this case, a contact hole does not exist in the first pad 310 disposed in an area crossing the conductive layer COM. Accordingly, the second pad 320 and the first pad 310 are electrically insulated from each other.

As described above, the second pads 320 disposed on the display panel 110, a plurality of data lines DL, the common voltage lines CVL disposed alternately with the plurality of data lines DL, and a plurality of separated common electrodes 112 is formed together in the manufacturing process of the display panel 110, so that a design change of the display panel 110 used in the display device 100 is minimized to develop a touch display panel used in the touch display device.

Figure 4B:
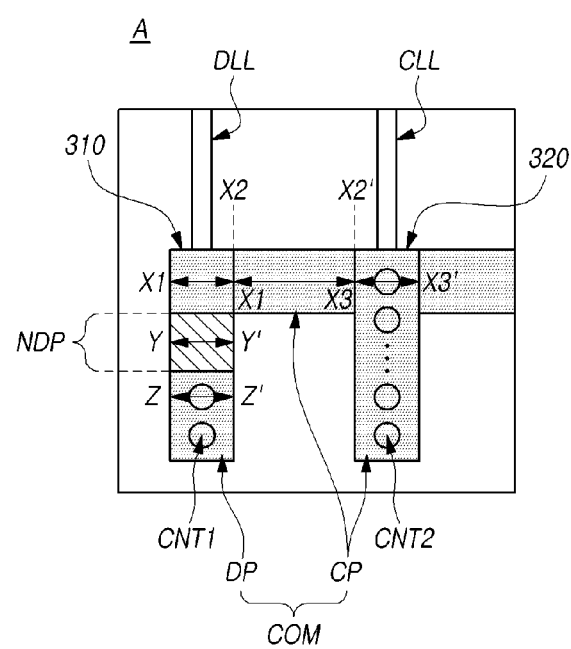
FIG. 4B is a partial enlarged view of a region A of FIG. 4A.

FIG. 4B is an enlarged view of a region A of FIG. 4A.

Referring to FIG. 4B, each of the plurality of data lines DL disposed in the display area DA is electrically connected to each of data link lines DLL of the pad portion 150. Each of the plurality of first pads 310 is electrically connected to each of the data link lines DLL. In other words, each of the first pads 310 is connected to each of the data lines DL through each of the respective data link lines DLL.

Each of the plurality of common voltage lines CVL disposed in the display area DA is electrically connected to each of common voltage link lines CLL of the pad portion 150. Each of the second pads 320 is electrically connected to each of the common voltage link lines CLL.

The pad portion 150 can include a conductive layer COM disposed on the plurality of first pads 310 and the plurality of second pads 320. The conductive layer COM can be disposed as, for example, the first pattern Pattern1. The data voltage Vdata can be applied to the first pad 310 and the common voltage Vcom can be applied to the second pad 320 by the first pattern Pattern1.

The first pattern Pattern1 can be configured as a data voltage application pattern DP for applying the data voltage Vdata to the plurality of data lines DL and a common voltage application pattern CP for applying the common voltage Vcom to the plurality of common electrodes 112.

The data voltage application pattern DP can be electrically connected to the data line DL through at least one first contact hole CNT1 provided in the first pad 310. Accordingly, when the data voltage Vdata is applied to the conductive layer COM, the first pad 310 can apply the data voltage Vdata to the connected data line DL.

The common voltage application pattern CP can be electrically connected to the common voltage line CVL through at least one second contact hole CNT2 provided in the second pad 320. Accordingly, when the common voltage Vcom is applied to the conductive layer COM, the second pad 320 can apply the common voltage Vcom to the common electrodes 112 through the connected common voltage line CVL.

The common voltage application pattern CP can be connected on two or more second pads 320. For example, the common voltage application pattern CP disposed on one of the second pads 320 can penetrate through an area on the adjacent first pad 310 and extend to an area on the other second pad 320. Accordingly, the same voltage can be applied to the two second pads 320 connected by the common voltage application pattern CP.

As the common voltage application pattern CP is disposed on the pad portion 150 so that the same voltage is applied to two or more second pads 320, the same voltage can be applied to the common voltage line CVL connected to each of the second pads 320. Accordingly, the same voltage can be applied to the common electrodes 112 connected to the common voltage line CVL. This voltage applied to the common electrodes 112 can be the common voltage Vcom.

The common voltage application pattern CP is electrically insulated from the data voltage application pattern DP. For example, when the conductive layer COM is formed on the pad portion 150, the conductive layer COM between the data voltage application pattern DP and the common voltage application pattern CP can be not disposed. Accordingly, the common voltage Vcom applied by the common voltage application pattern CP to the common electrodes 112 can be distinguished from the data voltage Vdata applied by the data voltage applying pattern DP to the data line DL.

Even if the common voltage application pattern CP penetrate through an area on the first pad 310, it is not electrically connected to the data line DL. In other words, the common voltage application pattern CP does not penetrate the area on the first pad 310 provided with the first contact hole CNT1, while it penetrates a partial area not provided with the first contact hole CNT1. On the other hand, when the area in which the first contact hole CNT1 is provided in the first pad 310 and the area in which the second contact hole CNT2 is provided in the second pad 320 are different from each other, it can be easier to form the conductive layer COM so that the data voltage application pattern DP and the common voltage application pattern CP are separated.

Figure 5A:
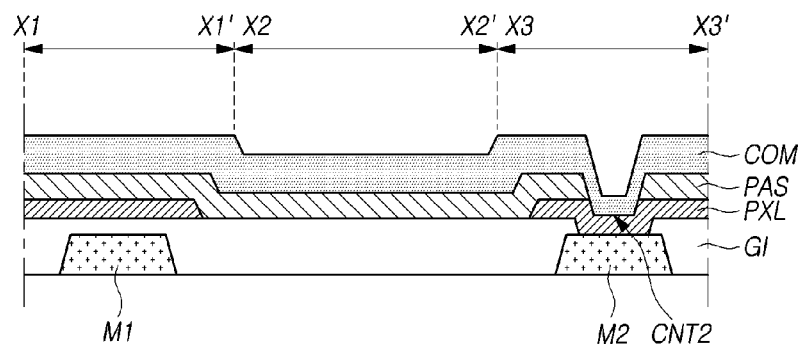
FIG. 5A is a cross-section view along X1-X1', X2-X2', and X3-X3' lines of FIG. 4B.

FIG. 5A is a cross-section view along X1-X1', X2-X2', and X3-X3' lines of FIG. 4B.

Referring to FIG. 5A, in the area of the first pad 310, the pad portion 150 includes a first metal layer M1, a gate insulating layer GI on the first metal layer M1, and a pixel electrode material layer PXL on the gate insulating layer GI, a passivation layer PAS on the pixel electrode material layer PXL, and a conductive layer COM on the passivation layer PAS.

The first metal layer M1 can be electrically connected to the data link line DLL. The gate insulating layer GI can be disposed on the first metal layer M1. The gate insulating layer GI can insulate the first metal layer M1 and the pixel electrode material layer PXL.

The pixel electrode material layer PXL can be disposed on the gate insulating layer GI. The pixel electrode material layer PXL can form a pixel electrode in the display area DA. The pixel electrode material layer PXL can be a transparent electrode layer such as an ITO layer.

The passivation layer PAS can be disposed on the pixel electrode material layer PXL. The passivation layer PAS can insulate the pixel electrode material layer PXL and the conductive layer COM.

The conductive layer COM can be disposed on the passivation layer PAS.

Referring to FIG. 5A again, the gate insulating layer GI and the pixel electrode material layer PXL are partially disposed in an area between the first pad 310 and the second pad 320 in the pad portion 150 so that the passivation layer PAS can be disposed on the GI, and the conductive layer COM can be disposed on the passivation layer PAS.

In the an area between the first pad 310 and the second pad 320, the pixel electrode material layer PXL on the gate insulating layer GI can be not disposed. Accordingly, the pixel electrode material layer PXL in the area of the first pad 310 can be electrically insulated from the pixel electrode material layer PXL in the area of the second pad 320.

The conductive layer COM in the area of the second pad 320 is connected to the conductive layer COM in the area of the first pad 310. Accordingly, the voltage applied to the conductive layer COM in the area of the second pad 320 can be transferred to the conductive layer COM in the area of the first pad 310.

Referring to FIG. 5A, in the area of the second pad 320, the pad portion 150 can include a second metal layer M2 and a gate insulating layer GI disposed in at least a partial area on the second metal layer M2.

At least a portion of the gate insulating layer GI is not disposed on the second metal layer M2, and the pixel electrode material layer PXL is disposed on the gate insulating layer GI and the second metal layer M2.

The passivation layer PAS is disposed in at least a portion of the pixel electrode material layer PXL. At least a portion of the passivation layer PAS is not disposed on the pixel electrode material layer PXL. In this case, the area in which at least a portion of the passivation layer PAS is not disposed can be an area corresponding to the area in which the gate insulating layer GI is not disposed on the second metal layer M2.

At least a portion of the conductive layer COM is disposed on the passivation layer PAS. The remaining part of the conductive layer COM can be disposed in an area in which the passivation layer PAS is not disposed. Accordingly, the conductive layer COM can be electrically connected to the pixel electrode material layer PXL in an area in which the passivation layer PAS is not disposed partially.

Since the pixel electrode material layer PXL is electrically connected to the second metal layer M2, the conductive layer COM can be electrically connected to the second metal layer M2 through the second contact hole CNT2.

Since the second metal layer M2 is electrically connected to the common voltage line CVL, the conductive layer COM can be electrically connected to the common voltage line CVL. Accordingly, the common voltage Vcom applied to the conductive layer COM can be applied to the common voltage line CVL disposed on the display panel 110.

Figure 6:
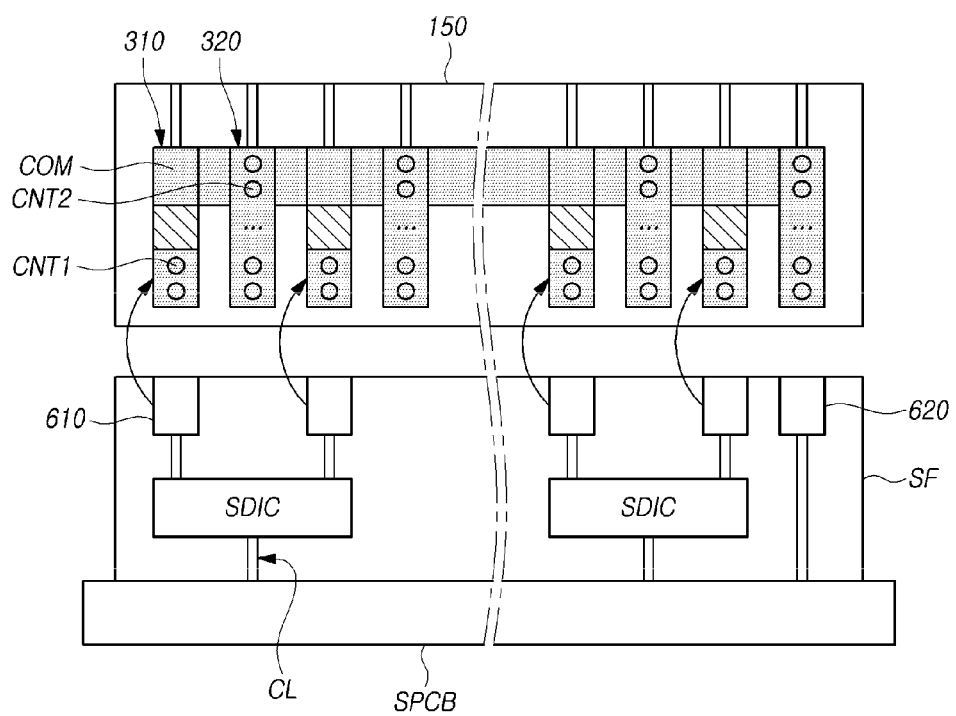
FIG. 6 illustrates a combination of a display panel and a data driver according to embodiments of the present disclosure.

Referring to FIGS. 5A and 6, the common voltage application pattern CP can be disposed on at least two second pads 320.

As described above, when a voltage is applied to the common voltage application pattern CP, the same voltage can be applied to a plurality of common electrodes 112. For example, even if a plurality of common electrodes 112 are disposed on the display panel 110, the plurality of common electrodes 112 can be driven like one common electrode.

Figure 5B:
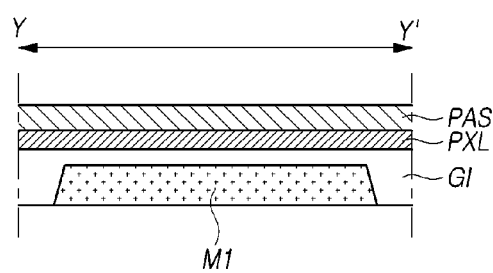
FIG. 5B is a cross-sectional view along Y-Y' line of FIG. 4B.

FIG. 5B is a cross-sectional view along Y-Y' line of FIG. 4B.

Referring to FIG. 5B, an area in which neither the data voltage application pattern DP nor the common voltage application pattern CP is disposed on the first pad 310 can be an area in which the passivation layer PAS is exposed to the outside, and can be referred to as a non-image pad pattern (NDP) area.

The pad portion 150 includes a first metal layer M1, a gate insulating layer GI on the first metal layer M1, and a passivation layer PAS on the first metal layer M1.

The conductive layer COM on the passivation layer PAS can be removed by etching in the manufacturing process of the display panel 110.

Since the conductive layer COM is not disposed in the area that between data voltage application pattern DP and common voltage application pattern CP, referred to NDP, the data voltage application pattern DP and the common voltage application pattern CP can be insulated from each other.

Figure 5C:
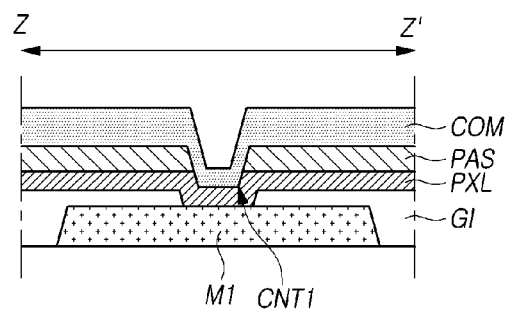
FIG. 5C is a cross-sectional view along Z-Z' line of FIG. 4B.

FIG. 5C is a cross-sectional view along Z-Z' line of FIG. 4B.

Referring to FIG. 5C, in an area in which the data application pattern DP is disposed on the pad portion 150, the pad portion 150 can include a first metal layer M1 and a gate insulating layer GI disposed in at least a partial area on the first metal layer M1.

The gate insulating layer GI can be not disposed in a partial area on the first metal layer M1.

The pixel electrode material layer PXL can be disposed on the gate insulating layer GI. The pixel electrode material layer PXL can be electrically connected to the first metal layer M1 in an area in which the gate insulating layer GI is not disposed.

The passivation layer PAS can be disposed in at least a portion of the pixel electrode material layer PXL. The passivation layer PAS printed on the pixel electrode material layer PXL can be not disposed by etching a partial area. The area in which the pixel electrode material layer PXL is not disposed can be an area corresponding to the area on the first metal layer M1 in which the gate insulating layer GI is not disposed.

The conductive layer COM can be disposed on the passivation layer PAS. In the area in which the passivation layer PAS is not disposed partially, the conductive layer COM can be disposed on the pixel electrode material layer PXL. For example, the conductive layer COM can be electrically connected to the first metal layer M1 through the first contact hole CNT1.

Further, since the first metal layer M1 is connected to the data line DL, the conductive layer COM can apply the data voltage Vdata to the data line DL.

Accordingly, as the data voltage application pattern DP is disposed on the first pad 310, the data voltage Vdata is applied to the plurality of data lines DL disposed on the display panel 110.

FIG. 6 illustrates a combination of a display panel 110 and a data driver 120 according to embodiments of the present disclosure.

Referring FIG. 6, the data driver 120 can include a source driver IC SDIC. The plurality of first pads 310 disposed on the pad portion 150 are electrically connected to the data driver integrated circuit SDIC, and the data driver integrated circuit SDIC applies the data voltage Vdata to a plurality of data lines DL disposed on the display panel 110.

The data driver integrated circuit SDIC can be mounted on the circuit film SF in the COF method. The circuit film SF can include a first connecting electrode 610 for connecting the data driver integrated circuit SDIC to each of the first pads 310. The first connecting electrode 610 can be connected to the data driver integrated circuit SDIC by a connecting line CL of the circuit film SF.

In this case, the first connecting electrode 610 can be connected to an area corresponding to the data voltage application pattern DP of the first pad 310. For example, the first connecting electrode 610 can be attached to the area corresponding to the data voltage application pattern DP of the first pad 310. In this case, in order to prevent the first connecting electrode 610 from contacting the common voltage application pattern CP, the area of the first connecting electrode 610 can be smaller than or equal to the area of the data voltage application pattern DP positioned on each of the first pads 310.

One side of the circuit film SF can be attached to the pad portion 150, and the other side thereof can be attached to the source printed circuit board SPCB. The data driver integrated circuit SDIC can receive a voltage for driving the plurality of data lines DL from the source printed circuit board SPCB through the connecting line CL of the circuit film SF.

When two or more data driver integrated circuits SDICs are mounted on the circuit film SF, each of source driver ICs SDICs is connected to the source printed circuit board SPCB through each connecting line CL.

The source printed circuit board SPCB can apply a voltage to the common voltage application pattern CP through the connecting line CL of the circuit film SF and the common voltage application electrode 620.

In this case, the common voltage application electrode 620 which the common voltage Vcom is applied from the connecting line CL can be disposed in an area corresponding to any one of the second pads 320. Accordingly, even if the connecting line CL is not physically connected to each of the plurality of second pads 320, the same common voltage Vcom can be applied to the plurality of second pads 320. Accordingly, a common voltage Vcom can be applied to a plurality of common electrodes 112 disposed on the display panel 110.

For example, the display panel 110 according to the present invention can apply the common voltage Vcom to the plurality of common electrodes 112 through the conductive layer COM connecting the plurality of second pads 320.

As will be described later, each of the second pads 320 can be driven by simply changing the design of the conductive layer COM of the pad portion 150 in the display panel 110. Therefore, the design of the metal layers M1 and M2, the pixel electrode material layer PXL, and the passivation layer PAS excluding the conductive layer COM in the display panel 110 as it is can be used in the touch display panel. Accordingly, the product development period can be shortened.

Figure 7:
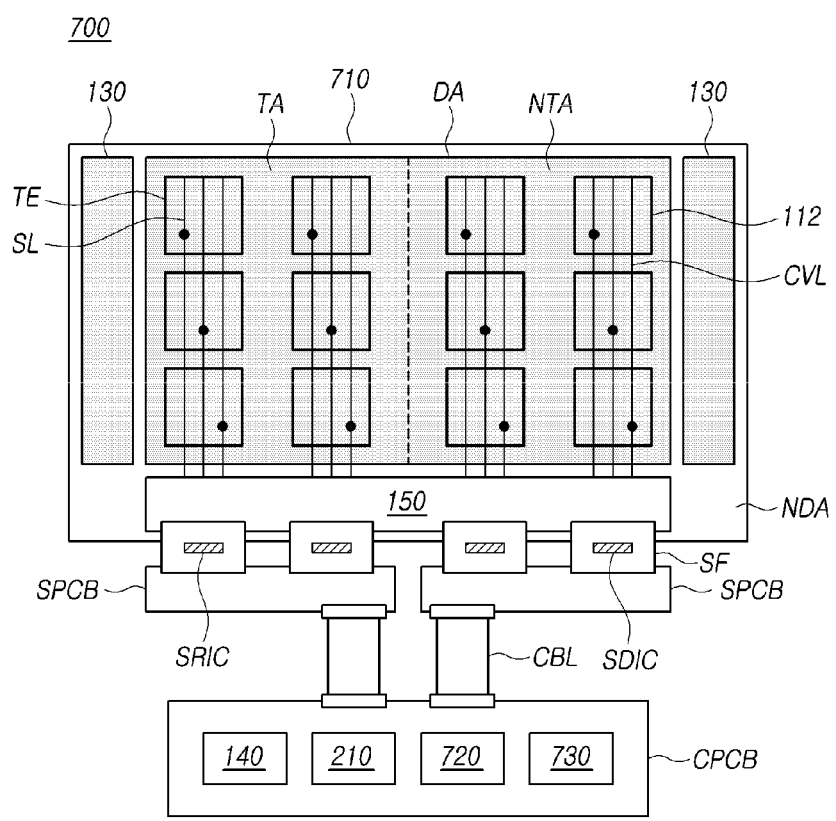
FIG. 7 illustrates a system of a touch display device 700 according to embodiments of the present disclosure.

FIG. 7 illustrates a system of a touch display device 700 according to embodiments of the present disclosure.

Referring to FIG. 7, the touch display device 700 according to the embodiments includes a touch display panel 710, a gate driver 130 disposed in the non-display area NDA, a pad portion 150, a circuit film SF on which a driving circuit such as a data driver integrated circuit SDIC and a touch driving integrated circuit SRIC is mounted, a source printed circuit board SPCB to which the pad portion 150 is connected through the circuit SF and a control printed circuit board CPCB. The gate driver 130, the pad portion 150, the circuit film SF, the source printed circuit board SPCB and the control printed circuit board CPCB is substantially the same as these of the display device 100 as shown in FIGS. 3 to 6.

The touch display panel 710 includes a touch area or touch sensing area TA providing a touch sensing function in at least a portion of the display area DA.

The touch display panel 710 can include a plurality of touch electrodes TE for sensing a touch in the touch area TA. As described above, when the touch display panel 710 is a built-in type, the plurality of common electrodes 112 disposed on the touch display panel 710 can be used as the touch electrodes TE for sensing the touch.

The touch display device 700 can alternately perform image display driving for image display and touch driving for touch sensing in the touch area TA. In this way, a method in which the image display driving and the touch driving are performed alternately in the same area is referred to as a time division driving method. According to this time division driving method, the touch display device 700 can alternate between an image display period DS for image display and a touch sensing period TS for touch sensing. In this case, during the image display period DS, the touch display device 700 can perform the image display driving in the touch area TA. In addition, during the touch sensing period TS, the touch display device 700 can perform the touch sensing driving in the touch area TA.

In some cases, the touch display device 700 can simultaneously perform the image display driving and the touch sensing driving in the touch area TA. In this way, a method in which the image display driving and the touch sensing driving are simultaneously performed is referred to as a simultaneous driving method.

The touch display device 700 is driven by a time division method as an example, but it is not limited thereof.

According to the time division driving method, the touch driving signal TDS can be applied to one or more of the plurality of touch electrodes TE during the touch sensing period TS. In this case, the plurality of data lines DL, the plurality of gate lines GL, and the remaining touch electrodes TE may not be driven. In this case, unnecessary parasitic capacitance can be formed in the touch electrode TE to which the touch driving signal TDS is applied by the data line DL disposed around the touch electrode TE, the gate line GL, or another adjacent touch electrode TE. Such unnecessary parasitic capacitance can decrease touch sensitivity by increasing a load on the sensing line SL connected to the corresponding touch electrode TE. Here, the sensing line SL can be a common voltage line CVL.

In order to remove such a load, the touch display device 700 can perform a load free drive LFD during the touch sensing period TS.

When the load free driving LFD is performed in the touch display device 700, the touch driving signal TDS can be applied to all or part of the plurality of touch electrodes TE. At this time, as an example, a data line load free driving signal DLFDS can be applied to at least one data line DL as a data voltage Vdata. As the other example, a gate line load free driving signal GLFDS is applied as a gate signal Vgate to all gate lines GL or at least one gate line GL in which the parasitic capacitance can be formed. As another example, a touch electrode load free driving signal TLFDS can be applied to all another touch electrodes TE or another adjacent touch electrode TE in which parasitic capacitance can be formed.

In the touch display device 700, during the touch sensing period TS, the same signal as the touch electrode load free driving signal TLFDS is applied to the plurality of common electrodes 112 in the non-touch or non-touch sensing area NTA. Such a signal applied to the non-touch area NTA can be referred to as an AC common voltage Vcom_AC.

During the image display period DS, a direct current signal for image display can be applied to the plurality of touch electrodes TE disposed in the touch area TA and the plurality of common electrodes 112 disposed in the non-touch area TNA. For example, such a signal applied to the plurality of touch electrodes TE and the plurality of common electrodes 112 during the display period DS can be referred to as a DC common voltage Vcom_DC.

Accordingly, the DC common voltage Vcom_DC is applied to the touch electrodes TE during the image display period DS. During the touch sensing period TS, the DC common voltage Vcom_DC can be applied at least one touch electrode TE, and the touch electrode load free driving signal TLFDS can be applied to all or part of the remaining touch electrodes TE.

The DC common voltage Vcom_DC can be applied to the common electrodes 112 during the image display period DS, and the AC common voltage Vcom_AC can be applied to the common electrodes during the touch sensing period TS.

Referring to FIG. 7 again, the touch display device 700 further includes a touch controller 720, a touch driving signal generating circuit 730, a touch driving integrated circuit SRIC, and the like.

The touch controller 720 outputs a pulse width modulation PWM signal in which a high level voltage and a low level voltage alternate to generate the touch driving signal TDS applied to the touch electrode TE.

The touch driving signal generation circuit 730 receives a voltage from the power management integrated circuit 210 and outputs the voltage to the touch driving integrated circuit SRIC which supplies the touch driving signal TDS to the touch electrode TE.

As another example, the touch controller 720 and the touch driving signal generation circuit 730 can be integrated as one driving circuit.

The touch driving signal generation circuit 730 can be connected to the data driver integrated circuit SDIC. Accordingly, the touch driving signal generation circuit 730 can apply voltage to the plurality of common electrodes 112 disposed in the non-touch area NTA through the data driver integrated circuit SDIC. Accordingly, the plurality of common electrodes 112 are applied with the DC common voltage Vcom_DC during the image display period DS through the common voltage line CVL, and with the AC common voltage Vcom_AC of a pulse type during the touch sensing period TS.

Figure 8:
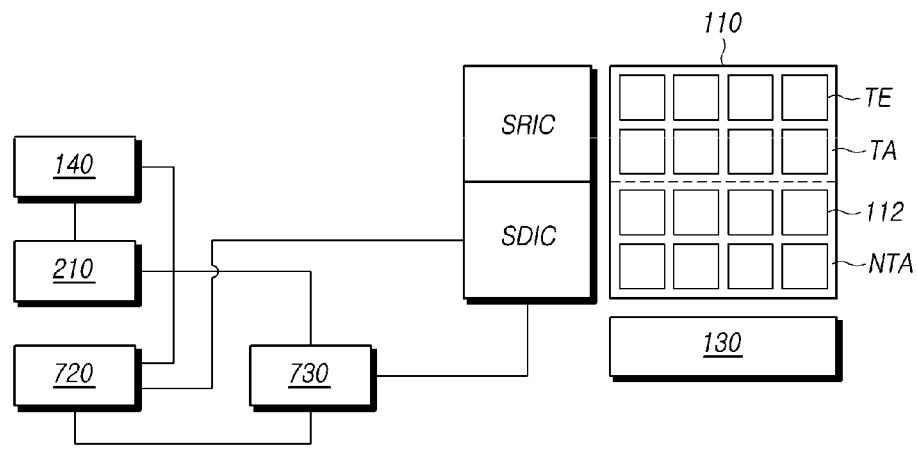
FIG. 8 schematically illustrates a signal flow in the touch display device of FIG. 7 according to embodiments of the present disclosure.

FIG. 8 schematically illustrates a signal flow in the touch display device of FIG. 7.

Referring to FIG. 8, the display controller 140 can input a touch synchronization signal Tsync to the power management integrated circuit 210. The touch synchronization signal Tsync can be a signal defining the image display period DS in which image display driving is performed and a touch period TS in which the touch sensing driving is performed in the touch display device 700.

The power management integrated circuit 210 can generate voltages for driving a plurality of circuits arranged in the touch display device 700 and voltages for generating various signals. The power management integrated circuit 210 can receive the touch synchronization signal Tsync from the display controller 140 and control an output timing of the signal. The power management integrated circuit 210 can supply signals for driving the image display to various circuits during the image display period DS, and can supply signals for driving touch sensing to various circuits during the touch sensing period TS.

The touch controller 720 can apply a pulse width modulation PWM signal to the touch driving signal generation circuit 730 during the touch sensing period TS. In some cases, the touch controller 720 can apply a pulse width modulation PWM signal to the touch driving integrated circuit SRIC and the data driver IC SDIC to control the output timing of the touch driving signal TD S.

The touch driving signal generation circuit 730 can drive the touch driving integrated circuit SRIC and the data driver integrated circuit SDIC according to the image display period DS and the touch sensing period TS.

FIG. 9A is a plan view of an example of the touch display panel of FIG. 7.

Referring to FIG. 9A, in order to supply the data voltage Vdata and the common voltage Vcom to the non-touch area NTA of the touch display panel 710, the conductive layer COM can be disposed on the pad unit 150 in the corresponding area thereof as described above in FIG. 4A.

For example, in order to electrically connect the plurality of second pads 320 to each other, the conductive layer COM is positioned on the second pad 320 across the first pad 310.

In addition, the conductive layer COM on the first pad 310 is electrically insulated from the second pad 320.

Meanwhile, in order to supply the data voltage Vdata, the common voltage Vcom, and the touch driving signal TDS to the touch area TA of the touch display panel 710, the conductive layer COM is disposed on the plurality of first pads 310 and the second pads 320, and pads are not electrically connected to each other. Accordingly, each of the second pads 320 can individually drive the common electrode 112 electrically connected thereto. Accordingly, the common electrode 112 divided into a plurality can be used as a touch electrode TE.

Figure 9B:
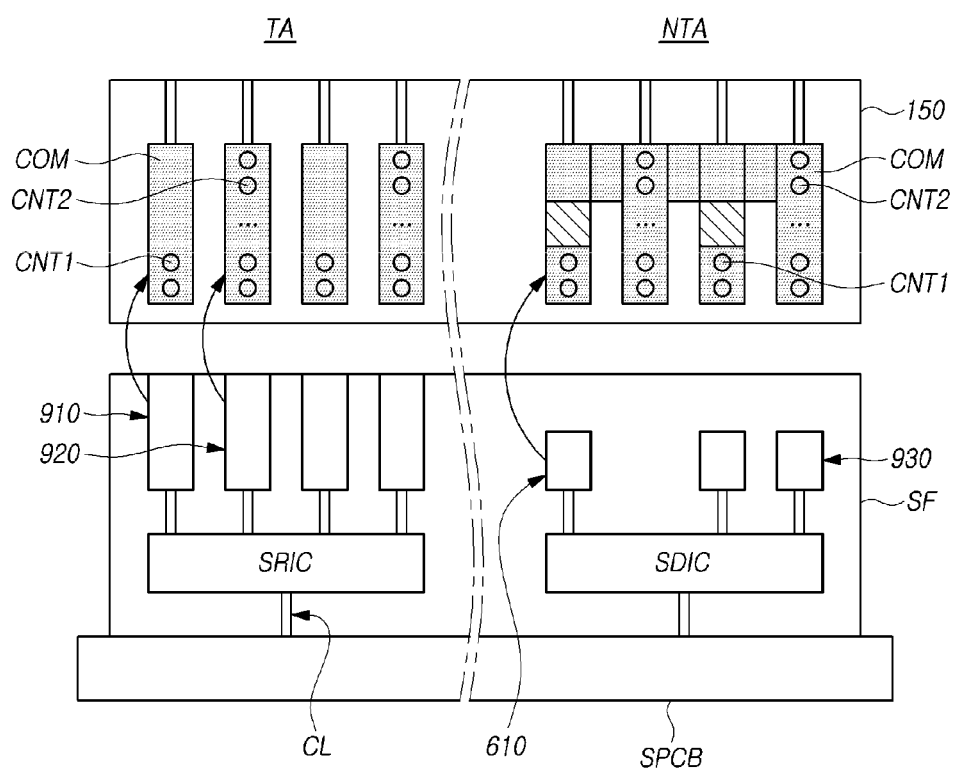
FIG. 9B illustrates a state in which a touch display panel according to embodiments of the present disclosure is combined with a data driver integrated circuit and a touch driving integrated circuit.

FIG. 9B illustrates a state in which a touch display panel 710 according to embodiments is combined with a data driver integrated circuit and a touch driving integrated circuit SRIC.

In the pad portion 150 of the non-touch area NTA, as the conductive layer COM is disposed in the pad portion 150 of the display device 100 described above, the conductive layer COM is formed of the first pattern Pattern1. The first pattern Pattern1 can be a pattern including the data voltage application pattern DP and the common voltage application pattern CP.

In addition, the conductive layer COM can be disposed in the pad portion 150 of the touch area TA in a second pattern Pattern2 different from the first pattern Pattern1.

In this case, the second pattern Pattern2 can mean a pattern in which the conductive layer COM is disposed in the same pattern on each of the first pad 310 and the second pad 320. For example, the conductive layer COM can be disposed on each of the first pad 310 and the second pad 320 while covering the entire first pad 310 and the second pad 320.

Accordingly, the pad portion 150 can be divided into the pad portion 150 in which the conductive layer COM is disposed as the first pattern Pattern1 and a pad portion 150 in which the conductive layer COM is disposed as the second pattern Pattern2.

The conductive layer COM of the first pattern Pattern 1 on the first pad 310 can supply the data voltage Vdata to the data line DL in the non-touch area NTA through a first contact hole CNT1.

During the image display period DS, the data voltage Vdata for the image display can be applied to the data lines DL in the non-touch area NTA. Also, during the touch sensing period TS, a data signal for the image display may not be applied to the data lines DL in the non-touch area NTA. In this case, the data line DL can be in a floating state. Alternatively, a data line load free driving signal DLFDS for reducing the parasitic capacitance can be applied to the data line DL in the non-touch area NTA.

The conductive layer COM of the first pattern Pattern1 on the second pad 320 can be electrically connected to a plurality of common voltage lines CVL in the non-touch area NTA through a second contact hole CNT2. During the image display period, the common voltage Vcom can be applied to at least two second pads 320 on which the common voltage application pattern CP is disposed. Specifically, during the image display period DS, the DC common voltage Vcom_DC for image display can be applied to the plurality of second pads 320.

During the touch sensing period TS, the AC common voltage Vcom_AC can be applied to the plurality of second pads 320 through the common voltage application pattern CP. The AC common voltage Vcom_AC can be a signal having the same frequency and amplitude as the touch electrode load free driving signal TLFDS.

The conductive layer COM of the second pattern Pattern2 can be disposed on the plurality of first pads 310 and the plurality of second pads 320, but insulated from each other.

The conductive layer COM of the second pattern Pattern2 can supply the data voltage Vdata to the data line DL disposed in the touch area TA through the first contact hole CNT1.

In this case, the data voltage Vdata for image display can be applied to the plurality of data lines DL disposed in the touch area TA during the image display period DS. In addition, during the touch sensing period TS, the data line load free driving signal DLFDS for reducing the parasitic capacitance can be applied to at least one data line DL among the plurality of data lines DL disposed in the touch area TA.

The conductive layer COM of the second pattern Pattern2 on the second pad 320 is can be connected to the plurality of sensing lines SL disposed in the touch area TA through the second contact hole CNT2. The conductive layer COM is electrically connected to each sensing line SL, so that even if the touch driving signal TDS is applied to a certain sensing line SL, the touch driving signal TDS is not applied to the other sensing line SL. Accordingly, each sensing line SL can be individually driven.

During the image display period DS, the DC common voltage Vcom_DC for image display can be applied to the second pad 320 in the pad portion 150 in which the conductive layer COM is disposed as the second pattern Pattern2. Also, during the touch sensing period TS, the touch driving signal TDS for touch sensing can be applied to at least one second pad 320. The touch electrode load free driving signal TLFDS can be applied to the entire or at least one second pad 320 of the remaining second pads 320 in the pad portion 150 in which the conductive layer COM is disposed in the second pattern Pattern2.

Referring to FIG. 9B again, the pad portion 150 can be connected to the data driver integrated circuit SDIC and the touch driving integrated circuit SRIC mounted on the circuit film SF, respectively.

The plurality of first pads 310 disposed on the pad portion 150 in which the conductive layer COM is disposed as the first pattern Pattern1 can be connected to the data driver integrated circuit SDIC through the first connecting electrode 610.

At least one second pad 320 of the plurality of second pads 320 disposed on the pad portion 150 in which the conductive layer COM is disposed as the first pattern Pattern1 can be connected to the data driver integrated circuit SDIC through the connecting line CL and the fourth connecting electrode 930 of the film SF.

The voltage applied to the at least one second pad 320 can be transmitted to the at least two second pads 320 through the common voltage application pattern CP. Accordingly, the common voltage Vcom can be applied to the plurality of common voltage lines CVL disposed in the non-touch area NTA.

Each of the plurality of first pads 310 disposed on the pad portion 150 in which the conductive layer COM is disposed as the second pattern Pattern2 can be connected to the second connecting electrode 910. In this case, the conductive layer COM disposed as the second pattern Pattern2 can be disposed in the first contact hole CNT1 provided in the plurality of first pads 310. Accordingly, the plurality of first pads 310 can be electrically connected to the touch driving integrated circuit SRIC. The touch driving integrated circuit SRIC can drive a plurality of data lines DL.

Each of the plurality of second pads 320 disposed on the pad portion 150 in which the conductive layer COM is disposed as the second pattern Pattern2 can be electrically connected to the touch driving integrated circuit SRIC. The touch driving integrated circuit SRIC can be supplied with a voltage by the third connecting electrode 920. When the touch driving integrated circuit SRIC is mounted on the circuit film SF, the third connecting electrode 920 can be connected to the touch driving integrated circuit SRIC by the connecting line CL.

In this case, on the plurality of second pads 320, a portion of the conductive layer COM disposed as the second pattern Pattern2 can be disposed in the second contact hole CNT2. Accordingly, the plurality of second pads 320 can be electrically connected to the touch driving integrated circuit SRIC. The touch driving integrated circuit SRIC can drive the plurality of sensing lines SL, respectively.

When the data driver integrated circuit SDIC and the touch driving integrated circuit SRIC are disposed in the COF method, the data driver integrated circuit SDIC and the touch driving integrated circuit SRIC can be electrically connected to the source printed circuit board SPCB through the connecting line.

Referring to FIG. 9B, in the touch display device 700, a data driver integrated circuit SDIC can be disposed to drive common voltage lines CVL arranged in the non-touch area NTA. For example, the touch driving integrated circuit SRIC can be used in the touch area TA to perform the image display driving and the touch sensing driving, and the data driver integrated circuit SDIC can be used in the non-touch area NTA to perform the image display driving. Accordingly, it is possible to reduce the cost of parts of the expensive touch driving integrated circuit SRIC by using the data driver integrated circuit SDIC in an area where the touch sensing function is not needed.

Figure 10:
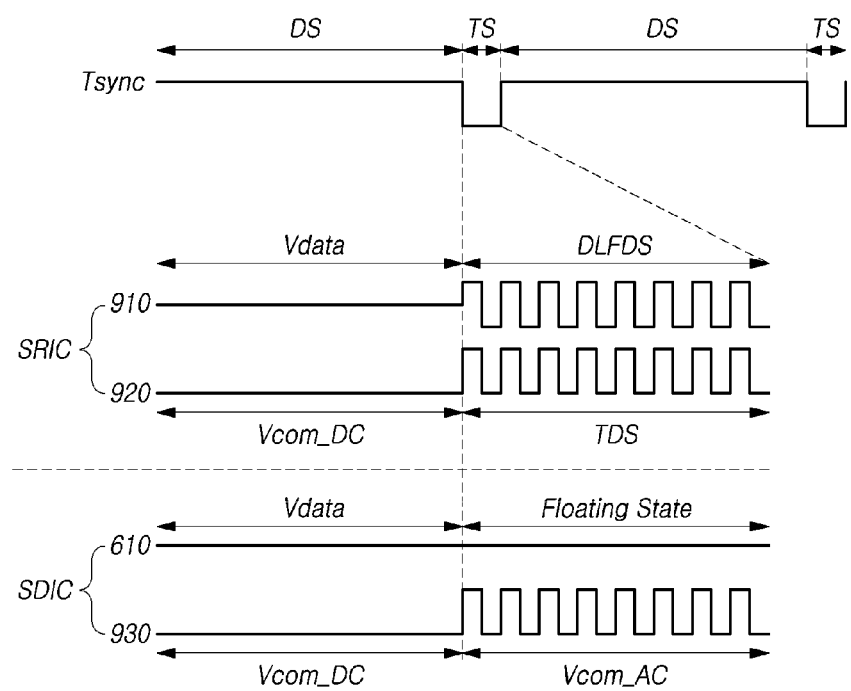
FIG. 10 illustrates waveforms of signals applied by a data driver circuit and a touch driver circuit during an image display period and a touch period in a touch display device according to embodiments of the present disclosure.

FIG. 10 illustrates waveforms of signals applied by a data driver circuit and a touch driving integrated circuit SRIC during an image display period DS and a touch sensing period TS in a touch display device 700 according to embodiments of the present disclosure.

Referring to FIG. 10, the touch synchronization signal Tsync can define the image display period DS for driving the image display and the touch sensing period TS. For example, the image display driving can be performed during a period in which the touch synchronization signal Tsync is at a high level, and the touch sensing driving can be performed during a period in which the touch synchronization signal Tsync is at a low level. In contrast, the image display driving can be performed during a period in which the touch synchronization signal Tsync is at a low level, and the touch sensing driving can be performed during a period in which the touch synchronization signal Tsync is at a high level.

In order to drive the plurality of data lines DL and the plurality of sensing lines SL disposed in the touch area TA, the touch driving integrated circuit SRIC outputs a signal for driving the image display during the image display period DS and a signal for driving the touch sensing during the touch period TS.

In order to drive the plurality of data lines DL and the plurality of common electrodes 112 arranged in the non-touch area NTA, the data driver integrated circuit SDIC outputs a signal for driving the display image during the image display period DS. In addition, during the touch sensing period TS, the data driver integrated circuit SDIC can apply the AC common voltage Vcom_AC to the plurality of common electrodes 112. In addition, during the touch sensing period TS, the data driver integrated circuit SDIC may not apply a voltage to the plurality of data lines DL. Accordingly, during the touch sensing period TS, the plurality of data lines DL disposed in the non-touch area NTA can be in a floating state in which a constant voltage is not applied.

As a result, at least two or more second pads 320 are connected by the conductive layer COM in the pad portion 150 where the plurality of first pads 310 and the plurality of second pads 320 are disposed, so that the touch display panel 710 can be easily changed and used to the display panel 110. For example, the display panel 110 and the touch display panel 710 can share the designs of the metal layers M1 and M2, the pixel electrode material layer PXL, and the passivation layer PAS, excluding the conductive layer COM. Thus, a difference in designs of the pad portion 150 between the display panel 110 and the touch display panel 710 can be minimized.

Accordingly, a panel used for the display device 100 and a panel used for the touch display device 700 can be shared.

The above description has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the present invention. The above description and the accompanying drawings provide an example of the technical idea of the present invention for illustrative purposes only. For example, the disclosed embodiments are intended to illustrate the scope of the technical idea of the present invention. Thus, the scope of the present invention is not limited to the embodiments shown, but is to be accorded the widest scope consistent with the claims. The scope of protection of the present invention should be construed based on the following claims, and all technical ideas within the scope of equivalents thereof should be construed as being included within the scope of the present invention.

What is claimed is:

1. A display panel comprising:
a plurality of first pads electrically connected to a plurality of data lines disposed in a display area of the display panel;
a plurality of second pads electrically connected to common voltage lines configured to drive a plurality of common electrodes disposed in the display area;
a conductive layer of a first pattern disposed in at least a partial area on the plurality of first pads, and electrically connected to the plurality of data lines; and
a conductive layer of a second pattern disposed in at least a partial area on the plurality of second pads, electrically connected to at least two or more of the plurality of common electrodes, and disposed separately from the first pattern,
wherein when the first pattern and the second pattern are a data voltage application pattern and a common voltage application pattern, respectively, at least a portion of the common voltage application pattern is disposed on the plurality of first pads, but spaced apart from the conductive layer of the first pattern.

2. The display panel according to claim 1, wherein the data voltage application pattern is electrically connected to each of the plurality of data lines through at least one first contact hole provided in the plurality of first pads.

3. The display panel according to claim 2, wherein the plurality of first pads comprise:
a first metal layer electrically connected to the plurality of data lines;
a gate insulating layer disposed on the first metal layer;
a pixel electrode material layer disposed on the gate insulating layer;
a passivation layer disposed on the pixel electrode material layer; and
the first contact hole provided through at least a portion of the gate insulating layer and at least a portion of the passivation layer, and
wherein the conductive layer of the first pattern is disposed in at least a partial area on the passivation layer, and is electrically connected to the plurality of data lines through the first contact hole.

4. The display panel according to claim 1, wherein the common voltage application pattern is electrically connected to the plurality of common voltage lines through at least one second contact hole provided in the plurality of second pads, extends from one second pad among the plurality of second pads to another second pad adjacent to the one second pad, and applies a common voltage to at least two common voltage lines through the one second contact hole provided in the one second pad and the another second contact hole provided in the other second pad.

5. The display panel according to claim 4, wherein the plurality of first pads and the plurality of second pads are alternately disposed, and
the common voltage application pattern is disposed through at least a partial area on the plurality of first pads.

6. The display panel according to claim 4, wherein the plurality of second pads comprise:
a second metal layer electrically connected to the plurality of common voltage lines, and a gate insulating layer disposed on the second metal layer;
a pixel electrode material layer disposed on the gate insulating layer;
a passivation layer disposed on the pixel electrode material layer; and
the second contact hole provided through at least a portion of the gate insulating layer and at least a portion of the passivation layer, and
wherein the conductive layer of the second pattern is disposed in at least a partial area on the passivation layer, and is electrically connected to the plurality of common voltage lines through the second contact hole.

7. The display panel according to claim 1, wherein, in the display area where the plurality of data lines and the plurality of common electrodes are disposed, a plurality of gate lines and a plurality of subpixels are further disposed, and the plurality of common electrodes overlap with at least one subpixel among the plurality of subpixels, and
in at least a portion of the non-display area other than the display area, a pad portion in which the plurality of first pads, the plurality of second pads, the conductive layer of the first pattern, and the conductive layer of the second pattern are disposed.

8. A display device comprising:
a display panel comprising a plurality of first pads electrically connected to a plurality of data lines disposed in a display area, a plurality of second pads electrically connected to common voltage lines driving a plurality of common electrodes disposed in the display area, a conductive layer of a first pattern disposed in at least a partial area on the plurality of first pads and electrically connected to the plurality of data lines, and a conductive layer of a second pattern disposed in at least a partial area on the plurality of second pads, electrically connected to at least two or more of the plurality of common electrodes, and disposed separately from the first pattern; and
a data driver configured to drive the plurality of data lines and the plurality of common voltage lines,
wherein data driver comprises one connecting line driving at least two or more common voltage lines among the plurality of common voltage lines, and
the connecting line is disposed in an area corresponding to one of the plurality of second pads, and drives at least two common voltage lines of the plurality of common voltage lines through the second pattern.

9. The display device according to claim 8, wherein the first pattern is a data voltage application pattern, and a conductive layer of the first pattern is electrically connected to each of the plurality of data lines through at least one first contact hole provided in the plurality of first pads, and
the second pattern is a common voltage application pattern and is electrically connected to the plurality of common voltage lines through at least one second contact hole provided in the plurality of second pads and connects at least two of the second pads among the plurality of second pads.

10. The display device according to claim 9, wherein the data driver further comprises a plurality of data voltage supply electrodes electrically connected to the plurality of first pads to supply a data voltage to the plurality of data lines, and an area of each of the data voltage supply electrodes is smaller than or equal to an area of each of the data voltage application patterns disposed on the plurality of first pads.

11. The display device according to claim 9, wherein an area in which the at least one first contact hole is disposed in each of the plurality of first pads is different from an area in which the at least one second contact hole is disposed in each of the plurality of second pads.

12. A touch display device comprising:
a display area comprising a touch area and a non-touch area;
a pad portion of a touch area disposed in at least a partial area of a non-display area other than the display area, wherein at least two pads for driving at least two lines disposed in the non-touch area are disposed, and the conductive layer disposed on the pads is disposed as a third pattern; and
a pad portion of a non-touch area disposed in the remaining partial area of the non-display area,
wherein the pads for driving the lines disposed in the non-touch area are disposed, and the conductive layer disposed on the pads is disposed as a fourth pattern different from the third pattern,
wherein the pad portion of the non-touch area comprises a plurality of first pads electrically connected to a plurality of data lines disposed in the non-touch area, a plurality of second pads electrically connected to a plurality of common voltage lines driving a plurality of common electrodes disposed in the non-touch area, the conductive layer of a data voltage application pattern disposed in at least a partial area on the plurality of first pads and electrically connected to the plurality of data lines, and a common voltage application pattern disposed in at least a partial area on the plurality of second pads, electrically connected to at least two or more of the plurality of common electrodes, and separated from the data voltage application pattern, and
wherein the pad portion of the touch area comprises a plurality of first pads electrically connected to the plurality of data lines disposed in the touch area, a plurality of second pads electrically connected to a plurality of sensing lines driving a plurality of touch electrodes disposed in the touch area; and the conductive layer insulated from each other on the plurality of first pads and the plurality of second pads.

* * * * *